United States Patent
Klee et al.

(10) Patent No.: US 6,653,913 B2
(45) Date of Patent: Nov. 25, 2003

(54) TUNABLE PIEZOELECTRIC FILTER ARRANGEMENT USING A DIELECTRIC MATERIAL WITH A VOLTAGE-DEPENDENT DIELECTRIC CONSTANT

(75) Inventors: Mareike Katharine Klee, Hueckelhoven (DE); Robert Frederick Milsom, Redhill (GB); Hans Peter Löbl, Monschau-Imgenbroich (DE); Rainer Kiewitt, Roetgen (DE); Uwe Mackens, Aachen (DE); Martinus Hermanus Wilhemus Maria Van Delden, Eindhoven (NL); Wilhelm Georg Hermann, Roetgen (DE); Olaf Wunnicke, Warburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/826,699

(22) Filed: Apr. 5, 2001

(65) Prior Publication Data

US 2001/0048352 A1 Dec. 6, 2001

(30) Foreign Application Priority Data

Apr. 6, 2000 (EP) .............................................. 00302923

(51) Int. Cl.$^7$ ................................................. H03H 9/56
(52) U.S. Cl. ......................... 333/188; 333/189; 333/191
(58) Field of Search ................................. 333/186–196, 333/133, 202, 205, 207

(56) References Cited

U.S. PATENT DOCUMENTS

| | | | | |
|---|---|---|---|---|
| 5,004,715 A | * | 4/1991 | Hakotani et al. ........... | 501/136 |
| 5,166,646 A | * | 11/1992 | Avanic et al. ........... | 333/193 X |
| 5,194,836 A | * | 3/1993 | Vale et al. ............... | 333/133 |
| 5,291,159 A | * | 3/1994 | Vale .......................... | 333/188 |
| 5,446,306 A | | 8/1995 | Stokes et al. ............. | 257/416 |
| 5,512,864 A | * | 4/1996 | Vig ............................ | 331/162 |
| 5,640,042 A | * | 6/1997 | Koscica et al. ......... | 333/995 X |
| 5,714,917 A | * | 2/1998 | Ella ....................... | 333/188 X |
| 5,721,194 A | * | 2/1998 | Yandrofski et al. ....... | 505/210 |
| 5,789,845 A | * | 8/1998 | Wadaka et al. ........... | 310/334 |
| 5,933,062 A | * | 8/1999 | Kommrusch .............. | 333/193 |
| 6,018,281 A | * | 1/2000 | Taguchi et al. ............ | 333/193 |
| 6,097,263 A | * | 8/2000 | Mueller et al. ........... | 333/17.1 |
| 6,111,482 A | * | 8/2000 | Atokawa .................... | 333/202 |

FOREIGN PATENT DOCUMENTS

| | | | | |
|---|---|---|---|---|
| DE | 4020467 A1 | | 1/1992 | |
| EP | 0843374 | * | 5/1998 | |
| EP | 1043741 A2 | | 10/2000 | |
| JP | 64-54917 | * | 3/1989 | ........... 333/202 |
| JP | 8-18392 | * | 1/1996 | |

OTHER PUBLICATIONS

"Physical Realization of Miniature Bandpass Filters with Single Sideband Characteristics", by Dale McLean, IEEE Transaction on Circuit Theory, Mar. 1967, pp. 102–103.

* cited by examiner

*Primary Examiner*—Barbara Summons
(74) *Attorney, Agent, or Firm*—Steven R. Biren

(57) ABSTRACT

The invention describes a tunable filter arrangement with at least two resonators which are coupled to one another and of which at least one is connected to a capacitor with tunable capacitance. The electrical properties of the resonator, and thus the overall filter characteristic, can be changed through a change in the capacitance of the capacitor. Furthermore, a transmitter, a receiver, a mobile telephone device, and a wireless data transmission system comprising such a filter arrangement are disclosed, as is a tunable bulk acoustic wave resonator.

7 Claims, 2 Drawing Sheets

TUNABLE PIEZOELECTRIC FILTER ARRANGEMENT USING A DIELECTRIC MATERIAL WITH A VOLTAGE-DEPENDENT DIELECTRIC CONSTANT

BACKGROUND AND SUMMARY OF THE INVENTION

The invention relates to a tunable filter arrangement. The invention further relates to a transmitter, a receiver, a mobile telephone device, and a cordless data transmission system with a tunable filter arrangement, as well as to a tunable bulk acoustic wave resonator.

The stormy developments in the field of mobile telephony and the continuous miniaturization of cordless telephone devices lead to higher requirements being imposed on the individual components. Thus a high selectivity in the high frequency part is necessary for protecting the receiver from the rising number of potentially interfering signals from other systems. This is achieved, for example, by means of bandpass filters which transmit only a limited frequency band and which suppress all frequencies above and below this band.

At the present moment, filters with ceramic electromagnetic resonators are among the means used for this purpose. A miniaturization of these filters, however, is limited by the electromagnetic wavelength. So-called surface acoustic wave (SAW) filters built up from surface acoustic wave resonators can be given a considerably smaller construction. This is because the acoustic wavelength is smaller than the electromagnetic wavelength by 4 to 5 orders of magnitude. A surface acoustic wave resonator comprises a piezoelectric layer on which finger-shaped electrodes are provided. A signal applied to the input electrodes excites the piezoelectric material into mechanical vibrations, which propagate in the form of acoustic waves on the upper side of the layer and are converted back into an electric signal again by the output electrodes.

An alternative is formed by bulk acoustic wave (BAW) filters comprising bulk acoustic wave resonators. Bulk acoustic wave filters have advantages as regards their size, power, and IC compatibility. Bulk acoustic wave resonators are built up from three components in principle. The first component generates the acoustic wave and comprises a piezoelectric layer. Two electrodes arranged above and below the piezoelectric layer represent the second component. The third component has the task of acoustically insulating the substrate from the vibrations generated by the piezoelectric layer.

It is an interesting aspect that the properties of a resonator or filter can be varied. This may be done, for example, through coupling of a resonator or filter with a varicap diode. It is a disadvantage of the combination of active and passive components that the active components may be contaminated by the materials of the passive components during the manufacture of the resonator or filter.

An alternative possibility is disclosed in U.S. Pat. No. 5,446,306. This describes a semiconductor bulk acoustic wave resonator and a semiconductor bulk acoustic wave filter which comprises a semiconducting substrate, a first and second electrode, and arranged therebetween a piezoelectric layer of AlN or ZnO. The resonance frequency of the resonator is changed in that a DC voltage is applied to the electrodes.

The invention has for its object to provide a tunable filter arrangement which can be manufactured in a simple and inexpensive manner.

This object is achieved by means of a tunable filter arrangement which comprises a substrate and provided thereon an arrangement of at least two mutually coupled resonators of which at least one is connected to a capacitor with tunable capacitance.

The electrical properties of the resonator, for example its resonance frequency or its anti-resonance frequency, can be changed through coupling of a resonator to a capacitor. If the resonator is present in a filter arrangement, these changes will influence the overall filter characteristic. Since the capacitor has a tunable, i.e. changeable capacitance value, these changes can be effected more or less strongly.

It is preferred that the capacitor comprises a dielectric of a material having a voltage-dependent relative dielectric constant $\in_r$.

Certain materials have a dielectric constant $\in$ which is strongly dependent on an applied voltage. When a DC voltage is applied to the first and the second electrode of a capacitor having a dielectric with a voltage-dependent relative dielectric constant $\in_r$, the value of the dielectric constant $\in_r$ will drop, and thus the capacitance of the capacitor. This also changes the influence of the capacitor on the electrical properties of the resonator to which it is coupled.

It is particularly highly preferred that the material with a voltage-dependent relative dielectric constant $\in_r$ is chosen from the group comprising $PbTi_{1-x}Zr_xO_3$ ($0 \leq x \leq 1$) with and without dopants of La, Nb or Mn with and without excess lead, $BaTiO_3$ with and without dopants, $SrTiO_3$ with and without dopants, $Ba_{1-x}Sr_xTiO_3$ ($0 \leq x \leq 1$) with and without dopants of Ca and Pb, $Ba_{1-x}Sr_xTiO_3$ ($0 \leq x \leq 1$)+MgO, $Ba_{1-x}Sr_xTiO_3$—$Pb_{1-y}Ca_yTiO_3$ ($0 \leq x \leq 1$, $0 \leq y \leq 1$), $CaTiO_3$ doped with Bi, $Sr_{n+1}Ti_nO_{3n+1}$ ($1 \leq n \leq 5$), $Pb_{1-x}Ca_xTiO_3$ ($0 \leq x \leq 1$), $Ba_{1-x}Sr_xTiO_3$ ($0 \leq x \leq 1$) with and without added $VO_x$ ($1 \leq x \leq 2.5$) and/or $SiO_2$, $Ba_{1-x}Sr_xZr_yTi_{1-y}O_3$ ($0 \leq x \leq 1$, $0 \leq y \leq 1$) with and without dopants, $Ba_{1-x}Pb_xTiO_3$ ($0 \leq x \leq 1$) with and without excess lead, $Ba_{1-x}Ca_xTiO_3$ ($0 \leq x \leq 1$), $SrZr_xTi_{1-x}O_3$ ($0 \leq x \leq 1$) with and without dopants, $[PbMg_{1/3}Nb_{2/3}O_3]_x$—$[PbTiO_3]_{1-x}$ ($0 \leq x \leq 1$), $(Pb,Ba,Sr)(Mg_{1/3}Nb_{2/3})_xTi_y(Zn_{1/3}Nb_{2/3})_{1-x-y}O_3$ ($0 \leq x \leq 1$, $0 \leq y \leq 1$), $Pb_{1-x}Ca_xTiO_3$ ($0 \leq x \leq 1$), $(Ba_{1-x+y/8}Sr_{x+y/8})_2Na_{1-y}Nb_5O_{15}$ ($0 \leq x \leq 1$, $0 \leq y \leq 1$) with and without excess $Na^+$, $(Ba_{1-x+y/8}Sr_{x+y/8})_2K_{1-y}Nb_5O_{15}$ ($0 \leq x \leq 1$, $0 \leq y \leq 1$) with and without excess $K^+$, $(Ba_{1-x}Sr_x)_2K_{1-3y}SE_yNb_5O_{15}$ ($0 \leq x \leq 1$, $0 \leq y \leq 1$, SE=ion from the group of rare earths), $Sr_2Ba_4Ti_2Nb_8O_{30}$, $BiNbO_4$ with and without $VO_x$ ($1 \leq x \leq 2.5$) and/or CuO dopants, $(Bi_{2-x}Zn_x)(Nb_{2-y}Zn_y)O_x$, $Bi_2(Zn_{1/3}Nb_{2/3})_2O_7$, a) $Pb(Mg_{1/2}W_{1/2})O_3$, b) $Pb(Fe_{1/2}Nb_{1/2})O_3$, c) $Pb(Fe_{2/3}W_{1/3})O_3$, d) $Pb(Ni_{1/3}Nb_{2/3})O_3$, e) $Pb(Zn_{1/3}Nb_{2/3})O_3$, f) $Pb(Sc_{1/2}Ta_{1/2})O_3$, combinations of the compounds a) to f) with $PbTiO_3$ and/or $Pb(Mg_{1/3}Nb_{2/3})O_3$ with and without excess lead and $Ba_{1-x}Zr_xTiO_3$ ($0 \leq x \leq 1$).

These materials show a particularly strong dependence of their dielectric constants $\in$ on an applied voltage.

It is preferred that the resonators are chosen from the group comprising bulk acoustic wave resonators, surface acoustic wave resonators, and LC resonators.

Filter arrangements comprising bulk acoustic wave resonators or surface acoustic wave resonators can be manufactured with a high quality factor Q and a high coupling factor k. LC resonators can be manufactured in a simple manner.

It is particularly preferred that the resonators are constructed in a thin-film technology process.

A construction of the resonators in thin-film technology on a substrate renders it possible to obtain such a filter arrangement with small dimensions.

It is particularly highly preferred that a bulk acoustic wave resonator comprises a resonator unit of a lower and an upper electrode as well as a piezoelectric layer arranged therebetween and a reflection element arranged between the substrate and the resonator unit.

Such a bulk acoustic wave resonator can be manufactured without cumbersome lithographic processes because the resonance frequency of the resonator is defined by the layer thickness of the piezoelectric layer. In addition, such a bulk acoustic wave resonator is clearly more robust that other types of bulk acoustic wave resonators such as single-crystal resonators, resonators with membranes, or resonators with an air gap.

In a preferred embodiment, the resonator connected to a capacitor of tunable capacitance is also connected to a further capacitor.

It is particularly highly preferred in this embodiment that at least one capacitor is connected in series with and at least one capacitor is connected in parallel to the resonator.

This embodiment offers a particularly wide range of possibilities for varying the filter characteristic.

The invention furthermore relates to a transmitter, a receiver, a mobile telephone device, and a wireless data transmission system provided with a tunable filter arrangement which comprises a substrate and provided thereon an arrangement of at least two mutually coupled resonators of which at least one is connected to a capacitor with tunable capacitance.

The invention furthermore relates to a tunable bulk acoustic wave resonator which comprises a substrate and provided thereon a resonator unit with a lower and an upper electrode as well as a piezoelectric layer arranged therebetween, and a reflection element which is arranged between the substrate and the resonator unit, which resonator is connected to a capacitor having a tunable capacitance value.

The electrical properties of the bulk acoustic wave resonator can be trimmed over a wide range through coupling of the resonator to a tunable capacitor.

BRIEF DESCRIPTION OF THE DRAWINGS

The invention will now be explained in more detail below with reference to two Figures and four embodiments, with FIG. 1 showing a bulk acoustic wave resonator of a tunable filter arrangement connected to two capacitors in cross-section, FIG. 2 showing the circuit diagram of an embodiment of a tunable filter arrangement, FIG. 3 being a plan view of a tunable filter arrangement with a circuit arrangement in accordance with FIG. 2, and FIG. 4 showing the filter curve of a tunable filter arrangement.

DESCRIPTION OF THE PREFERRED EMBODIMENTS

Figure 1:
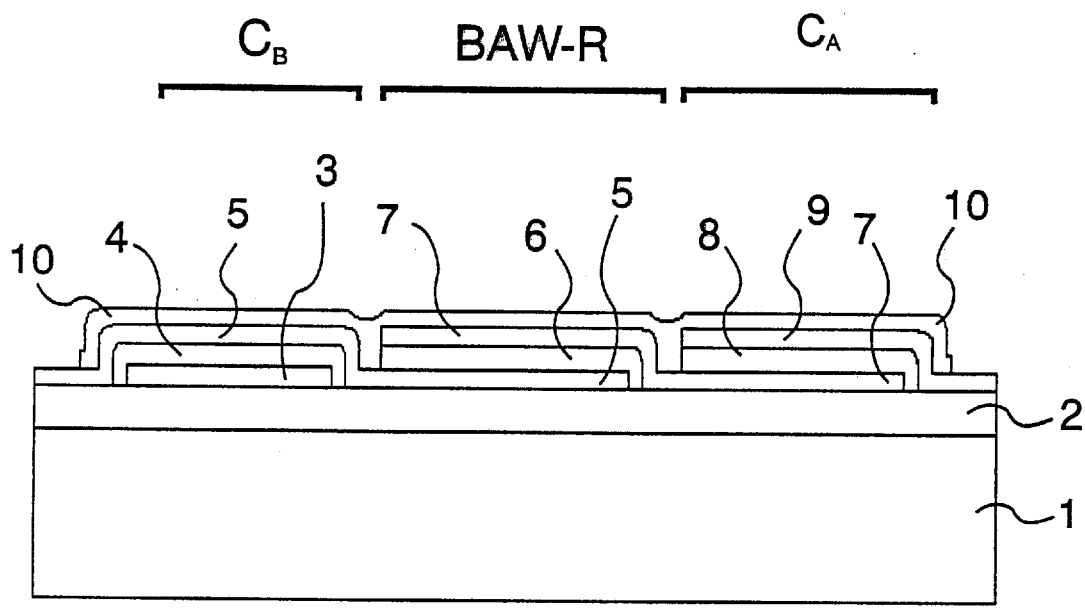

In FIG. 1, a tunable filter arrangement comprises a substrate 1 which comprises, for example, a ceramic material, a ceramic material with a glass planarizing layer, a glass-ceramic material, a glass material, Si, GaAs, or sapphire. If silicon or GaAs is used as the substrate 1, an additional passivating layer, for example made of $SiO_2$ or glass, is provided. On the substrate 1 there is a reflection element 2 which is formed by a layer of an acoustically reflecting substance from the group of polymers and porous substances. The acoustically reflecting substance used may be, for example, an aerogel, a xerogel, a glass foam, a foam-type adhesive, a foamed synthetic resin, or a synthetic resin of low density. The aerogel used may be, for example, an inorganic aerogel composed of silica gel or porous $SiO_2$ structures, or an organic aerogel such as, for example, a resorcin-formaldehyde aerogel, a melamine-formaldehyde aerogel, or a phenol-formaldehyde aerogel. The xerogel used may be, for example, an inorganic xerogel such as highly condensed polysilicic acid or an organic xerogel such as glue or agar-agar. Foamed substances used may be, for example, chemically or physically foamed polymers such as, for example, polystyrol, polycarbonate, polyvinyl chloride, polyurethane, polyisocyanate, polyisocyanurate, polycarbodiimide, polymethacrylimide, polyacrylimide, acryl-butadiene-styrol copolymers, polypropylene, or polyester. In addition, foamed synthetic resins such as, for example, phenol-formaldehyde resins or furane resins having a high porosity owing to carbonatization may be used. The synthetic resin of low density used may be, for example, a cross-linked polyvinyl ether, a cross-linked polyaryl ether, polytetrafluoroethylene, poly(p-xylylene), poly(2-chloro-p-xylylene), poly(dichloro-p-xylylene), polybenzocyclobutene, a styrol-butadiene copolymer, an ethylene-vinyl-acetate polymer, or an organic siloxane polymer. Resonator units and capacitor units are provided on the reflection element 2. A resonator unit comprises a first electrode 5, a piezoelectric layer 6, and a second electrode 7. The electrodes 5 and 7 are preferably made from a well conducting material of low acoustic damping and may comprise, for example, $Ag_{1-x}Pt_x$ ($0 \leq x \leq 1$), Pt with a layer thickness from 50 nm to 1 $\mu$m, Ti with a layer thickness from 1 to 20 nm/Pt with a layer thickness from 20 to 600 nm, Ti with a layer thickness from 1 to 20 nm/Pt with a layer thickness from 20 to 600 nm/Ti with a layer thickness from 1 to 20 nm, Pt with a layer thickness from 20 to 600 nm/Ti with a layer thickness from 1 to 20 nm, Al, Al doped with Cu, Al doped with Si, Al doped with Mg, W, Ni, Mo, Au, Cu, Ti/Pt/Al, Ti/Ag, Ti/Ag/Ti, Ti/Ag/Ir, Ti/Ir, Ti/Pd, $Ti/Ag_{1-x}Pt_x$ ($0 \leq x \leq 1$), $Ti/Ag_{1-x}Pd_x$ ($0 \leq x \leq 1$), $Ti/Pt_{1-x}Al_x$ ($0 \leq x \leq 1$), $Pt_{1-x}Al_x$ ($0 \leq x \leq 1$), $Ti/Ag/Pt_{1-x}Al_x$ ($0 \leq x \leq 1$), Ti/Ag/Ru, $Ti/Ag/Ir/IrO_x$ ($0 \leq x \leq 2$), $Ti/Ag/Ru/RuO_x$ ($0 \leq x \leq 2$), $Ti/Ag/Ru/Ru_xPt_{1-x}$ ($0 \leq x \leq 1$), $Ti/Ag/Ru/Ru_xPt_{1-x}/RuO_y$ ($0 \leq x \leq 1$, $0 \leq y \leq 2$), $Ti/Ag/Ru/RuO_x/Ru_yPt_{1-y}$ ($0 \leq x \leq 2$, $0 \leq y \leq 1$), $Ti/Ag/Ru_xPt_{1-x}$ ($0 \leq x \leq 1$), $Ti/Ag/Pt_xAl_{1-x}$ ($0 \leq x \leq 1$), $Pt_xAl_{1-x}/Ag/Pt_yAl_{1-y}$ ($0 \leq x \leq 1$, $0 \leq y \leq 1$), $Ti/Ag/Pt_y(RhO_x)_{1-y}$ ($0 \leq x \leq 2$, $0 \leq y \leq 1$), $Ti/Ag/Rh/RhO_x$ ($0 \leq x \leq 2$), $Ti/Ag/Pt_xRh_{1-x}$ ($0 \leq x \leq 1$), $Ti/Ag/Pt_y(RhO_x)_{1-y}/Pt_zRh_{1-z}$ ($0 \leq x \leq 2$, $0 \leq y \leq 1$, $0 \leq z \leq 1$), $Ti/Ag_xPt_{1-x}/Ir$ ($0 \leq x \leq 1$), $Ti/Ag_xPt_{1-x}/Ir/IrO_y$ ($0 \leq x \leq 1$, $0 \leq y \leq 2$), $Ti/Ag_xPt_{1-x}/Pt_yAl_{1-y}$ ($0 \leq x \leq 1$, $0 \leq y \leq 1$), $Ti/Ag_xPt_{1-x}/Ru$ ($0 \leq x \leq 1$), $Ti/Ag_xPt_{1-x}/Ru/RuO_y$ ($0 \leq x \leq 1$, $0 \leq y \leq 2$), Ti/Ag/Cr, Ti/Ag/Ti/ITO, Ti/Ag/Cr/ITO, Ti/Ag/ITO, Ti/Ni/ITO, Ti/Rh, Ti/Ru, Rh, $Rh/RhO_2$, Ti/Ni/Al/ITO, Ti/Ni, Ti/W/Ti, $W_xTi_{1-x}$ ($0 \leq x \leq 1$), $W_xTi_{1-x}/Al(Cu)$ ($0 \leq x \leq 1$), $W_xTi_{1-x}/Al(Si)$ ($0 \leq x \leq 1$), $W_xTi_{1-x}/Al$ ($0 \leq x \leq 1$) or Ti/Cu. The material for the piezoelectric layer 6 may be chosen, for example, from the group of AlN, ZnO, $PbTi_{1-x}Zr_xO_3$ ($0 \leq x \leq 1$) with and without dopants of La or Mn, $LiNbO_3$, $LiTaO_3$, $PbNb_2O_6$, $Pb_{1-x}Ca_xTiO_3$ ($0 \leq x \leq 1$), $[Pb(Mg_{1/3}Nb_{2/3})O_3]$—$[PbTiO_3]_{1-x}$ ($0 \leq x \leq 1$), $BaTiO_3$, $K_{1-x}Na_xNbO_3$ ($0 \leq x \leq 1$), $(Cd,Na)NbO_3$, $(Bi,Na)TiO_3$, $(Bi,Na,Pb,Ba)TiO_3$, $Bi_7Ti_4NbO_{21}$, $(Ba_{1-x}Sr_x)_2NaNb_5O_{15}$ ($0 \leq x \leq 1$), $(Ba_{1-x}Sr_x)_2KNb_5O_{15}$ ($0 \leq x \leq 1$), a) $Pb(Mg_{1/2}W_{1/2})O_3$,
b) $Pb(Fe_{1/2}Nb_{1/2})O_3$, c) $Pb(Fe_{2/3}W_{1/3})O_3$, d) $Pb(Ni_{1/3}Nb_{2/3})O_3$, e) $Pb(Zn_{1/3}Nb_{2/3})O_3$, f) $Pb(Sc_{1/2}Ta_{1/2})O_3$, combinations of the compounds a) to f) with $PbTiO_3$ and $Pb(Mg_{1/3}Nb_{2/3})O_3$ with and without excess lead, and polyvinylidene fluoride (PVDF).

Two capacitors CA and CB are provided on the reflection element 2 in the vicinity of the resonator units. The capacitor CA has a tunable capacitance and comprises a dielectric 8 of a material which has a voltage-dependent relative dielectric constant $\in_r$. The capacitor $C_B$ need not necessarily have a tunable capacitance and comprises the dielectric 4.

The electrodes 5 and 7 of the resonator unit may be structured such that they each at the same time form an electrode of one of the capacitors $C_A$ and $C_B$.

Thus, for example, the electrode 7 may be structured such that it also forms the lower electrode of the capacitor $C_A$ with tunable capacitance. A dielectric 8 is provided on the lower electrode of the capacitor $C_A$, and an upper electrode 9 is provided on the dielectric 8 so as to form the upper electrode 9 of the capacitor $C_A$. The dielectric 8 comprises a material with a voltage-dependent relative dielectric constant $\in_r$ such as, for example, $PbTi_{1-x}Zr_xO_3$ ($0 \leq x \leq 1$) with and without dopants of La, Nb or Mn with and without excess lead, $BaTiO_3$ with and without dopants, $SrTiO_3$ with and without dopants, $Ba_{1-x}Sr_xTiO_3$ ($0 \leq x \leq 1$) with and without dopants of Ca and Pb, $Ba_{1-x}Sr_xTiO_3$ ($0 \leq x \leq 1$)+MgO, $Ba_{1-x}Sr_xTiO_3$—$Pb_{1-y}Ca_yTiO_3$ ($0 \leq x \leq 1$, $0 \leq y \leq 1$), $CaTiO_3$ doped with Bi, $Sr_{n+1}Ti_nO_{3n+1}$ ($1 \leq n \leq 5$), $Pb_{1-x}Ca_xTiO_3$ ($0 \leq x \leq 1$), $Ba_{1-x}Sr_xTiO_3$ ($0 \leq x \leq 1$) with and without added $VO_x$ ($1 \leq x \leq 2.5$) and/or $SiO_2$, $Ba_{1-x}Sr_xZr_yTi_{1-y}O_3$ ($0 \leq x \leq 1$, $0 \leq y \leq 1$) with and without dopants, $Ba_{1-x}Pb_xTiO_3$ ($0 \leq x \leq 1$) with and without excess lead, $Ba_{1-x}Ca_xTiO_3$ ($0 \leq x \leq 1$), $SrZr_xTi_{1-x}O_3$ ($0 \leq x \leq 1$) with and without dopants, $[PbMg_{1/3}Nb_{2/3}O_3]_x$—$[PbTiO_3]_{1-x}$ ($0 \leq x \leq 1$), $(Pb,Ba,Sr)(Mg_{1/3}Nb_{2/3})_xTi_y(Zn_{1/3}Nb_{2/3})_{1-x-y}O_3$ ($0 \leq x \leq 1$, $0 \leq y \leq 1$), $Pb_{1-x}Ca_xTiO_3$ ($0 \leq x \leq 1$), $(Ba_{1-x+y/8}Sr_{x+y/8})_2Na_{1-y}Nb_5O_{15}$ ($0 \leq x \leq 1$, $0 \leq y \leq 1$) with and without excess $Na^+$, $(Ba_{1-x+y/8}Sr_{x+y/8})_2K_{1-y}Nb_5O_{15}$ ($0 \leq x \leq 1$, $0 \leq y \leq 1$) with and without excess $K^+$, $(Ba_{1-x}Sr_x)_2K_{1-3y}SE_yNb_5O_{15}$ ($0 \leq x \leq 1$, $0 \leq y \leq 1$, SE=ion from the group of rare earths), $Sr_2Ba_4Ti_2Nb_8O_{30}$, $BiNbO_4$ with and without $VO_x$ ($1 \leq x \leq 2.5$) and/or $CuO$ dopants, $(Bi_{2-x}Zn_x)(Nb_{2-y}Zn_y)O_x$, $Bi_2(Zn_{1/3}Nb_{2/3})_2O_7$, a) $Pb(Mg_{1/2}W_{1/2})O_3$, b) $Pb(Fe_{1/2}Nb_{1/2})O_3$, c) $Pb(Fe_{2/3}W_{1/3})O_3$, d) $Pb(Ni_{1/3}Nb_{2/3})O_3$, e) $Pb(Zn_{1/3}Nb_{2/3})O_3$, f) $Pb(Sc_{1/2}Ta_{1/2})O_3$, combinations of the compounds a) to f) with $PbTiO_3$ and/or $Pb(Mg_{1/3}Nb_{2/3})O_3$ with and without excess lead and $Ba_{1-x}Zr_xTiO_3$ ($0 \leq x \leq 1$).

The electrode 9 of the capacitor $C_A$ may comprise, for example, $Ag_{1-x}Pt_x$ ($0 \leq x \leq 1$), Pt with a layer thickness of 50 nm to 1 μm, Ti with a layer thickness from 1 to 20 nm/Pt with a layer thickness from 20 to 600 nm, Ti with a layer thickness from 1 to 20 nm/Pt with a layer thickness from 20 to 600 nm/Ti with a layer thickness from 1 to 20 nm, Pt with a layer thickness from 20 to 600 nm/Ti with a layer thickness from 1 to 20 nm, W, Ni, Mo, Au, Cu, Ti/Pt/Al, Ti/Ag, Ti/Ag/Ti, Ti/Ag/Ir, Ti/Ir, Ti/Pd, Ti/$Ag_{1-x}Pt_x$ ($0 \leq x \leq 1$), Ti/$Ag_{1-x}Pd_x$ ($0 \leq x \leq 1$), Ti/$Pt_{1-x}Al_x$ ($0 \leq x \leq 1$), $Pt_{1-x}Al_x$ ($0 \leq x \leq 1$), Ti/Ag/$Pt_{1-x}Al_x$ ($0 \leq x \leq 1$), Ti/Ag/Ru, Ti/Ag/Ir/$IrO_x$ ($0 \leq x \leq 2$), Ti/Ag/Ru/$RuO_x$ ($0 \leq x \leq 2$), Ti/Ag/Ru/$Ru_xPt_{1-x}$ ($0 \leq x \leq 1$), Ti/Ag/Ru/$Ru_xPt_{1-x}$/$RuO_y$ ($0 \leq x \leq 1$, $0 \leq y \leq 2$), Ti/Ag/Ru/$RuO_x$/$Ru_yPt_{1-y}$ ($0 \leq x \leq 2$, $0 \leq y \leq 1$), Ti/Ag/$Ru_xPt_{1-x}$ ($0 \leq x \leq 1$), Ti/Ag/$Pt_xAl_{1-x}$ ($0 \leq x \leq 1$), $Pt_xAl_{1-x}$/Ag/$Pt_yAl_{1-y}$ ($0 \leq x \leq 1$, $0 \leq y \leq 1$), Ti/Ag/$Pt_y(RhO_x)_{1-y}$ ($0 \leq x \leq 2$, $0 \leq y \leq 1$), Ti/Ag/Rh/$RhO_x$ ($0 \leq x \leq 2$), Ti/Ag/$Pt_xRh_{1-x}$ ($0 \leq x \leq 1$), Ti/Ag/$Pt_y(RhO_x)_{1-y}$/$Pt_zRh_{1-z}$ ($0 \leq x \leq 2$, $0 \leq y \leq 1$, $0 \leq z \leq 1$), Ti/$Ag_xPt_{1-x}$/Ir ($0 \leq x \leq 1$), Ti/$Ag_xPt_{1-x}$/Ir/$IrO_y$ ($0 \leq x \leq 1$, $0 \leq y \leq 2$), Ti/$Ag_xPt_{1-x}$/$Pt_yAl_{1-y}$ ($0 \leq x \leq 1$, $0 \leq y \leq 1$), Ti/$Ag_xPt_{1-x}$/Ru ($0 \leq x \leq 1$), Ti/$Ag_xPt_{1-x}$/Ru/$RuO_y$ ($0 \leq x \leq 1$, $0 \leq y \leq 2$), Ti/Ag/Cr, Ti/Ag/Ti/ITO, Ti/Ag/Cr/ITO, Ti/Ag/ITO, Ti/Ni/ITO, Ti/Rh, Ti/Ru, Rh, Rh/$RhO_2$, Ti/Ni/Al/ITO, Ti/Ni, Ti/W/Ti, $W_xTi_{1-x}$ ($0 \leq x \leq 1$), $W_xTi_{1-x}$/Al(Cu) ($0 \leq x \leq 1$), $W_xTi_{1-x}$/Al(Si) ($0 \leq x \leq 1$), $W_xTi_{1-x}$/Al ($0 \leq x \leq 1$), Al, Al doped with Cu, Al doped with Mg, Al doped with Si or Ti/Cu.

The further capacitor $C_B$ is composed from a lower electrode 3, a dielectric 4, and an upper electrode. The lower electrode 5 of the resonator unit may be structured such that, for example, it also forms the upper electrode of this capacitor.

The dielectric 4 of the capacitor $C_B$ may comprise, for example, $SiO_2$, $Si_3N_4$, $Ta_2O_5$, $Si_xN_yO_z$ ($0 \leq x \leq 1$, $0 \leq y \leq 1$, $0 \leq z \leq 1$), $SiO_2$/$Si_3N_4$/$SiO_2$, $Ba_{1-x}Sr_xTiO_3$ ($0 \leq x \leq 1$), $SrTi_{1-x}Zr_xO_3$ ($0 \leq x \leq 1$) with or without Mn dopants, BaO—$Ln_2O_3$—$TiO_2$ (Ln=La, Ce, Nd, Sm or Eu), $Al_2O_3$, $Ba_2Ti_9O_{20}$, $Ba_2Ti_{9-x}Zr_xO_{20}$ ($0 \leq x \leq 1$) with or without Mn dopants, $BaTi_5O_{11}$, $BaTi_4O_9$, $Nb_2O_5$, $TiO_2$, $(Ta_2O_5)_x$—$(Al_2O_3)_{1-x}$ ($0 \leq x \leq 1$), $(Ta_2O_5)_x$—$(TiO_2)_{1-x}$ ($0 \leq x \leq 1$), $(Ta_2O_5)_x$—$(Nb_2O_5)_{1-x}$ ($0 \leq x \leq 1$), $(Ta_2O_5)_x$—$(SiO_2)_{1-x}$ ($0 \leq x \leq 1$), (Sr,Ca)(Ti,Zr)$O_3$, BaO—SrO—$Nd_2O_3$—$Gd_2O_3$—$Nb_2O_3$—$TiO_2$, $CaSm_2Ti_5O_{14}$, Zr(Ti,Sn)$O_4$, BaO—PbO—CaO—$Nd_2O_3$—$Pr_2O_3$—$Bi_2O_3$—$TiO_2$, Ba(Zr,Zn,Ta)$O_3$, $CaTiO_3$—$LaAlO_3$, $(Bi_3(Ni_2Nb)O_9)_{1-x}(Bi_2(ZnNb_{2(1+d)y}O_{3+6y+5y d})_x$ ($0 \leq x \leq 1$, $0.5 \leq y \leq 1.5$, $-0.05 \leq d \leq 0.05$), $BiNbO_4$ with or without dopants of $VO_x$ ($0 \leq x \leq 2.5$), Ba(Zr,Ta)$O_3$, $(Bi_{2-x}Zn_x)(Zn_{2-y}Nb_y)O_7$ ($0 \leq x \leq 1$, $0 \leq y \leq 1$) or $Bi_2(Zn_{1/3}Nb_{2/3})_2O_7$. The lower electrode 3 may comprise, for example, $Ag_{1-x}Pt_x$ ($0 \leq x \leq 1$), Pt with a layer thickness from 50 nm to 1 μm, Ti with a layer thickness from 1 to 20 nm/Pt with a layer thickness from 20 to 600 nm, Ti with a layer thickness from 1 to 20 nm/Pt with a layer thickness from 20 to 600 nm/Ti with a layer thickness from 1 to 20 nm, Pt with a layer thickness from 20 to 600 nm/Ti with a layer thickness from 1 to 20 nm, W, Ni, Mo, Au, Cu, Ti/Pt/Al, Ti/Ag, Ti/Ag/Ti, Ti/Ag/Ir, Ti/Ir, Ti/Pd, Ti/$Ag_{1-x}Pt_x$ ($0 \leq x \leq 1$), Ti/$Ag_{1-x}Pd_x$ ($0 \leq x \leq 1$), Ti/$Pt_{1-x}Al_x$ ($0 \leq x \leq 1$), $Pt_{1-x}Al_x$ ($0 \leq x \leq 1$), Ti/Ag/$Pt_{1-x}Al_x$ ($0 \leq x \leq 1$), Ti/Ag/Ru, Ti/Ag/Ir/$IrO_x$ ($0 \leq x \leq 2$), Ti/Ag/Ru/$RuO_x$ ($0 \leq x \leq 2$), Ti/Ag/Ru/$Ru_xPt_{1-x}$ ($0 \leq x \leq 1$), Ti/Ag/Ru/$Ru_xPt_{1-x}$/$RuO_y$ ($0 \leq x \leq 1$, $0 \leq y \leq 2$), Ti/Ag/Ru/$RuO_x$/$Ru_yPt_{1-y}$ ($0 \leq x \leq 2$, $0 \leq y \leq 1$), Ti/Ag/$Ru_xPt_{1-x}$ ($0 \leq x \leq 1$), Ti/Ag/$Pt_xAl_{1-x}$ ($0 \leq x \leq 1$), $Pt_xAl_{1-x}$/Ag/$Pt_yAl_{1-y}$ ($0 \leq x \leq 1$, $0 \leq y \leq 1$), Ti/Ag/$Pt_y(RhO_x)_{1-y}$ ($0 \leq x \leq 2$, $0 \leq y \leq 1$), Ti/Ag/Rh/$RhO_x$ ($0 \leq x \leq 2$), Ti/Ag/$Pt_xRh_{1-x}$ ($0 \leq x \leq 1$), Ti/Ag/$Pt_y(RhO_x)_{1-y}$/$Pt_zRh_{1-z}$ ($0 \leq x \leq 2$, $0 \leq y \leq 1$, $0 \leq z \leq 1$), Ti/$Ag_xPt_{1-x}$/Ir ($0 \leq x \leq 1$), Ti/$Ag_xPt_{1-x}$/Ir/$IrO_y$ ($0 \leq x \leq 1$, $0 \leq y \leq 2$), Ti/$Ag_xPt_{1-x}$/$Pt_yAl_{1-y}$ ($0 \leq x \leq 1$, $0 \leq y \leq 1$), Ti/$Ag_xPt_{1-x}$/Ru ($0 \leq x \leq 1$), Ti/$Ag_xPt_{1-x}$/Ru/$RuO_y$ ($0 \leq x \leq 1$, $0 \leq y \leq 2$), Ti/Ag/Cr, Ti/Ag/Ti/ITO, Ti/Ag/Cr/ITO, Ti/Ag/ITO, Ti/Ni/ITO, Ti/Rh, Ti/Ru, Rh, Rh/$RhO_2$, Ti/Ni/Al/ITO, Ti/Ni, Ti/W/Ti, $W_xTi_{1-x}$ ($0 \leq x \leq 1$), $W_xTi_{1-x}$/Al(Cu) ($0 \leq x \leq 1$), $W_xTi_{1-x}$/Al(Si) ($0 \leq x \leq 1$), $W_xTi_{1-x}$/Al ($0 \leq x \leq 1$), Al, Al doped with Cu, Al doped with Si, Al doped with Mg, or Ti/Cu.

Alternatively, the lower electrode of the capacitor CA and the upper electrode of the capacitor $C_B$ may be formed through deposition of a separate electrically conducting layer.

A protective layer 10 of an organic or inorganic material, or a combination of these materials, may be provided over the entire filter arrangement. The organic material used may be, for example, polybenzocyclobutene or polyimide, and the inorganic material may be, for example, $Si_3N_4$, $SiO_2$, or $Si_xO_yN_z$ ($0 \leq x \leq 1$, $0 \leq y \leq 1$, $0 \leq z \leq 1$).

Contact holes may be opened to the electrodes 3, 5, 7, and 9 through the protective layer 10 by means of etching. Bump end contacts of Cr/Cu or Cr/Cu/Ni/Au may be grown in the contact holes. The contact to the filter input, to the filter output, and to ground may be effected through these bump end contacts. In addition, a DC voltage in a range of 1 to 100 V may be applied to the two electrodes 7, 9 of the capacitor $C_A$, in dependence on the layer thickness of the dielectric 8.

The resonator unit and the capacitors can be electrically interconnected through vias in the piezoelectric layer 6 of the resonator unit and in the dielectric layers 4 and 8 of the capacitors $C_A$ and $C_B$.

Alternatively, the reflection element 2 may comprise several layers of high and low acoustic impedance in alternation, each layer having a layer thickness of one fourth the resonance wavelength λ. The material of low acoustic impedance may be, for example, an organic or inorganic aerogel, an organic or inorganic xerogel, a glass foam, a foam-type adhesive, a foamed synthetic resin, a synthetic resin of low density, or $SiO_2$. The material of high acoustic impedance may be, for example, $HfO_2$, Mo, Au, Ni, Cu, W, Ti/W/Ti, $W_xTi_{1-x}$ ($0 \leq x \leq 1$), diamond, $Ta_2O_5$, AlN, Pt, Ti/Pt, or a synthetic resin of high density such as, for example, high-density polyethylene (HDPE). It is also possible for the lower electrode 5 of the resonator to be at the same time the upper layer of the λ/4 layers of the reflection element 2.

In a further embodiment of the invention, a second reflection element may be provided on the upper electrode 7 of the bulk acoustic wave resonator.

A further alternative is to provide an additional adhesive layer, for example made of an acrylate glue or an epoxy glue, between the reflection element 2 and the substrate 1. The acrylate glue may comprise, for example, acryl or methacryl monomers which polymerize during the curing process.

Furthermore, a layer of $SiO_2$ with a layer thickness of between 30 and 300 nm may be provided above or below, or above and below a reflection element 2 made of porous $SiO_2$. These $SiO_2$ layers, the reflection element 2, and a second reflection element may be provided over the entire region of the substrate 1 or only partly, in the region of a resonator unit.

In addition, the entire filter arrangement may be provided with at least a first and a second current supply contact. The current supply contact used may be, for example, an electroplated SME end contact of Cr/Cu, Ni/Sn, or Cr/Cu, Cu/Ni/Sn, or Cr/Ni, Pb/Sn, or Cr/Cu, Ni/Au, or a bump end contact of Cr/Cu or Cr/Cu/Ni/Au, or a contact pad.

If so desired, an alternative type of bulk acoustic wave resonator such as, for example, a single-crystal resonator, a resonator with a membrane, or a resonator with an air gap may be used in the tunable filter arrangement, or a surface acoustic wave resonator with a correspondingly adapted design of the electrodes 3, 5 and the piezoelectric layer 4. It is also possible to use LC resonators which are built up from coils and capacitors.

Alternative embodiments as to the construction and integration are known to those skilled in the art. Thus, for example, a tunable filter arrangement may comprise more than two resonators. It is also possible for two or more resonators to be connected to one capacitor with tunable capacitance value in a tunable filter arrangement. If a resonator is connected to several capacitors, the latter may be connected to the resonator in a wide variety of circuit arrangements.

Figure 2:
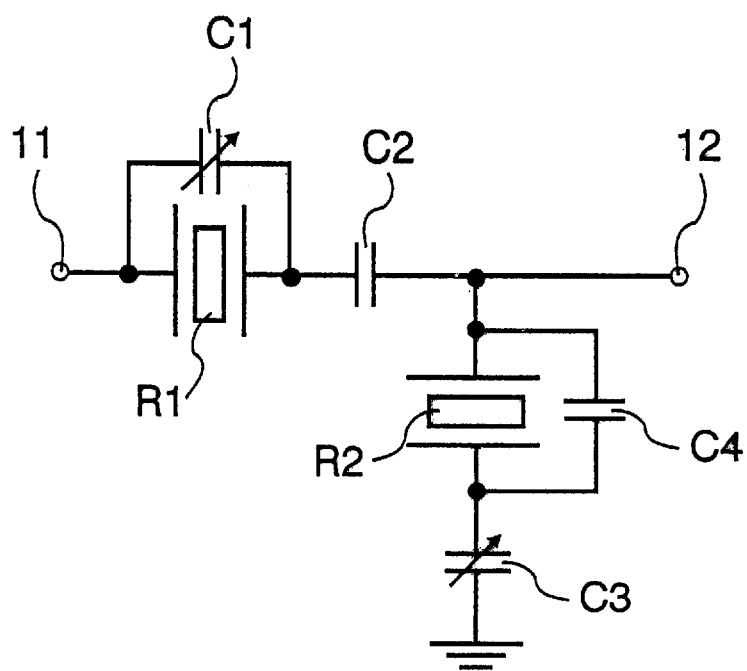

FIG. 2 shows the circuit diagram of a tunable filter arrangement. This filter arrangement, which represents no more than one out of many possible embodiments of the invention, comprises a series resonator R1 and a parallel resonator R2 connected between a filter input 11 and a filter output 12. A capacitor C1 is connected in parallel to the resonator R1, while a further capacitor C2 is connected in series downstream of the resonator R1. A capacitor C3 is connected downstream in series with the parallel resonator R2, and a capacitor C4 is connected in parallel to the resonator R2. The second terminal of the serial capacitor C3 is connected to ground. The capacitors C1 and C3 have trimmable capacitance values.

Figure 3:
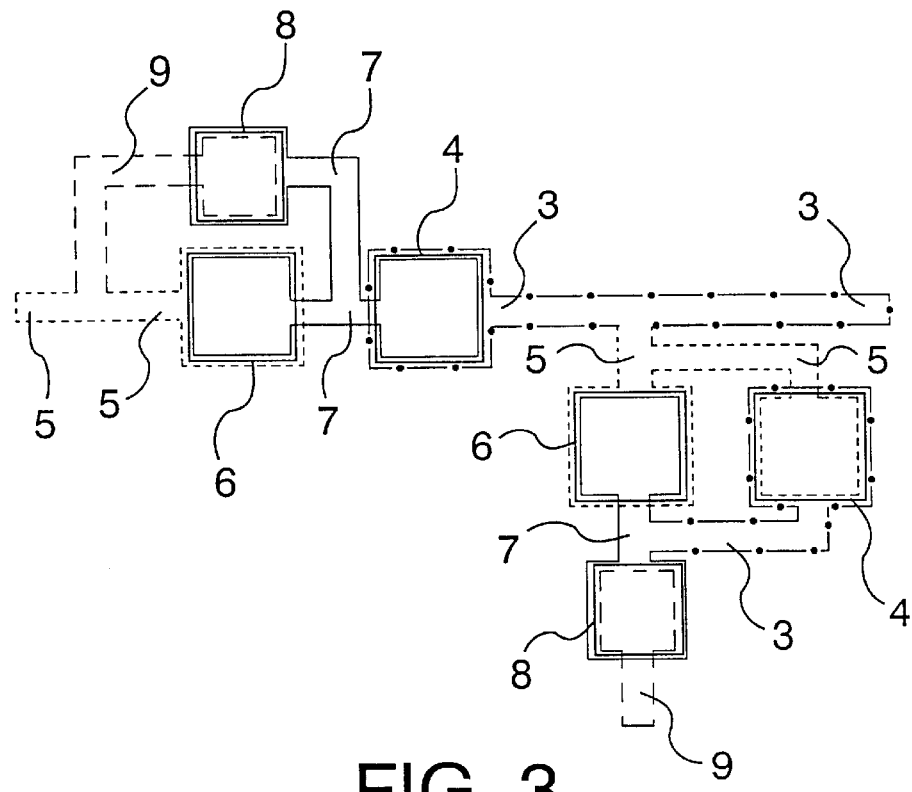

FIG. 3 is a diagrammatic plan view of a filter arrangement with a circuit in accordance with FIG. 2 and a possible design of the electrodes 3, 5, 7, and 9, the dielectrics 4 and 8, and the piezoelectric layer 6.

Figure 4:
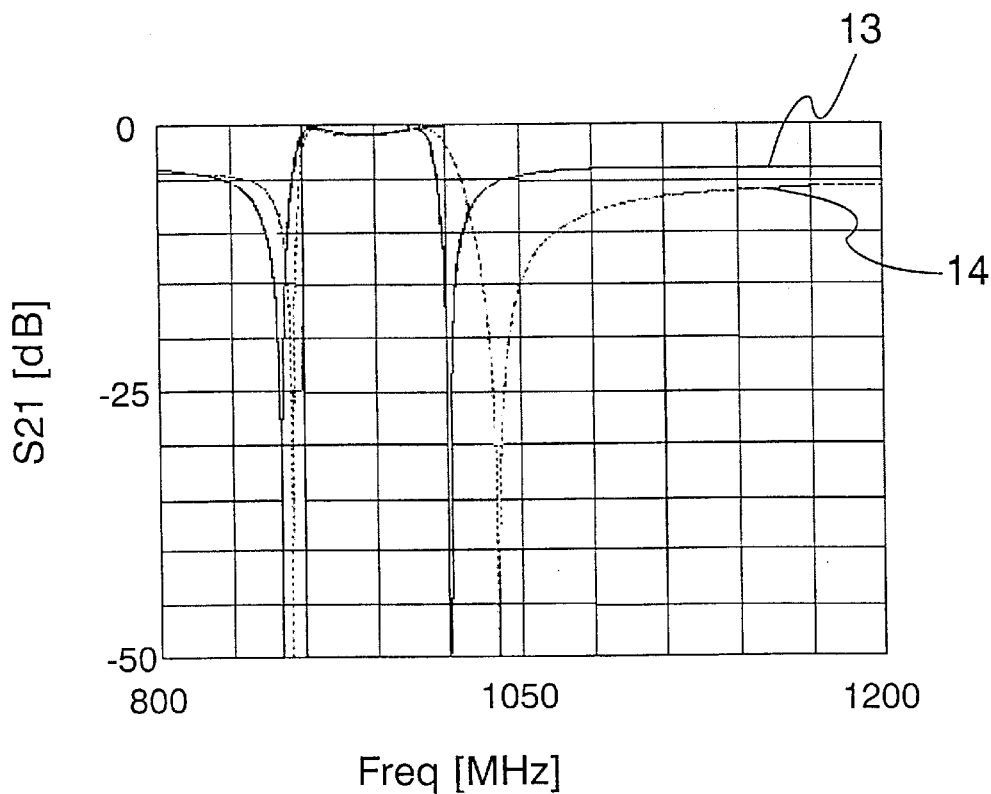

FIG. 4 shows the filter curves of a tunable filter arrangement of FIG. 2. Curve 13 here shows the filter characteristic of the filter arrangement without a DC voltage being applied to the electrodes of the capacitors C1 and C3. Curve 14 shows the changed filter characteristic when a DC voltage of 5 V is applied to the capacitors C1 and C3.

Embodiments of the invention will be explained in more detail below, representing examples of how the invention may be realized in practice.

Embodiment 1

An adhesive layer of an acrylate glue is present on a substrate 1 of glass, and thereon are arranged a 300 nm thick layer of $SiO_2$, a reflection element 2 of porous $SiO_2$, and a 30 nm thick layer of $SiO_2$. An electrode 5 of Pt/Ti is present en the 30 nm thick $SiO_2$ layer. A piezoelectric layer 6 of $PbZr_{0.35}Ti_{0.65}O_3$ lies on the electrode 5, and an electrode 7 of Ti/Pt is present on the piezoelectric layer 6. The piezoelectric layer 6 and the two electrodes 5, 7 are deposited and structured such that a filter arrangement with a series resonator R1 and a parallel resonator R2 are created. The electrode 5 is deposited and structured such that it also forms the upper electrode of a capacitor C4 adjacent the resonator R2. The electrode 7 is deposited and structured such that it forms the lower electrode of a capacitor C1 as well as the upper electrode of a capacitor C2 in the region of the bulk acoustic wave resonator R2, and forms the lower electrode of a capacitor C3 in the region of the bulk acoustic wave resonator R2. A dielectric 8 of $PbZr_{0.53}Ti_{0.47}O_3$ with 5% lanthanum doping lies on the lower electrodes 7 of the capacitors C1 and C3, and an upper electrode 9 of Pt/Ti is provided on the respective dielectrics 8. The capacitors C2 and C4 each comprise besides an upper electrode of Pt/Ti a dielectric 4 of $Si_3N_4$ and a lower electrode 3 of Al doped with 4% Cu.

A protective layer 10 of $SiO_2$ is provided over the entire filter arrangement. Contact holes are etched through the protective layer 10 to the electrodes 3, 5, 7, and 9. Bump end contacts of Cr/Cu/Ni/Au are grown in the contact holes.

A bump end contact to the electrode 5 in the region of the resonator R1 serves as a contact to the filter input 11 of the filter arrangement, and a bump end contact to the electrode 3 in the region of the capacitor C2 serves as a contact for the filter output 12 of the filter arrangement. In addition, a bump end contact to the electrode 9 in the region of the capacitor C3 is connected to ground.

The capacitors C1, C2, C3, and C4 and the resonators R1 and R2 are electrically interconnected through suitable vias in the piezoelectric layer 6, the dielectric 8, and the dielectric 4. The capacitor C1 is connected in parallel to the resonator R1, whereas the capacitor C2 is connected in series downstream of the resonator R1. The capacitor C3 is connected in series downstream of the resonator R2, and the capacitor C4 is connected in parallel to the resonator R2.

The two resonators R1 and R2 are mutually attuned such that the resonance frequency of the resonator R1 corresponds to the anti-resonance frequency of the resonator R2. The filter characteristic of the filter arrangement can be changed through the application of a DC voltage to the capacitors C1 and C3, because the relative dielectric constant $\in_r$ of the material of the dielectric 8 is changed thereby. The application of a DC voltage of a few volts is capable of reducing the capacitance values of the capacitors C1 and C3 by up to a factor 10. As a result, the resonance frequencies and the anti-resonance frequencies of the resonators R1 and R2 are shifted, and the filter curve of the filter arrangement is shifted by a few percents. The DC voltage is applied to the electrodes 7 and 9 of the capacitors C1 and C3 through the bump end contacts.

FIG. 4 shows an example of such a shift. The series resonator R1 has a resonance frequency of 1 GHz, and the parallel resonator R2 has a resonance frequency of 0.95035 GHz. The four capacitors without a DC voltage applied to the electrodes of the capacitors C1 and C3 have the following capacitance values: C1=2 pF, C2=100 pF, C3=100 pF, and C4=10 pF. The filter characteristic of this filter arrangement is shown in curve 13. After a DC voltage of 20 V has been applied, the capacitance values of C1 and C3 are reduced by the factor 10, and the bandwidth of the filter is shifted to higher frequencies. Curve 14 corresponds to this new filter characteristic.

The resulting filter arrangement was used in mobile telephones as a tunable bandpass filter whose filter band can be changed.

Embodiment 2

An adhesive layer of an acrylate glue is present on a substrate 1 of glass, and thereon are arranged a 300 nm thick layer of $SiO_2$, a reflection element 2 of porous $SiO_2$, and a 30 nm thick layer of $SiO_2$. An electrode 5 of Pt/Ti is present on the 30 nm thick $SiO_2$ layer. A piezoelectric layer 6 of AlN lies on the electrode 5, and an electrode 7 of Ti/Pt is present on the piezoelectric layer 6. The piezoelectric layer 6 and the two electrodes 5, 7 are deposited and structured such that a filter arrangement with a series resonator R1 and a parallel resonator R2 are created. The electrode 5 is deposited and structured such that it also forms the upper electrode of a capacitor C4 adjacent the resonator R2. The electrode 7 is deposited and structured such that it forms the lower electrode of a capacitor C1 as well as the upper electrode of a capacitor C2 in the region of the bulk acoustic wave resonator R2, and forms the lower electrode of a capacitor C3 in the region of the bulk acoustic wave resonator R2. A dielectric 8 of $PbZr_{0.53}Ti_{0.47}O_3$ with 5% lanthanum doping lies on the lower electrodes 7 of the capacitors C1 and C3, and an upper electrode 9 of Pt/Ti is provided on the respective dielectrics 8. The capacitors C2 and C4 each comprise besides an upper electrode of Pt/Ti a dielectric 4 of $Si_3N_4$ and a lower electrode 3 of Al doped with 4% Cu.

A protective layer 10 of $SiO_2$ is provided over the entire filter arrangement. Contact holes are etched through the protective layer 10 to the electrodes 3, 5, 7, and 9. Bump end contacts of Cr/Cu/Ni/Au are grown in the contact holes.

A bump end contact to the electrode 5 in the region of the resonator R1 serves as a contact to the filter input 11 of the filter arrangement, and a bump end contact to the electrode 3 in the region of the capacitor C2 serves as a contact for the filter output 12 of the filter arrangement. In addition, a bump end contact to the electrode 9 is connected to ground in the region of the capacitor C3.

The capacitors C1, C2, C3, and C4 and the resonators R1 and R2 are electrically interconnected through suitable vias in the piezoelectric layer 6, the dielectric 8, and the dielectric 4. The capacitor C1 is connected in parallel to the resonator R1, whereas the capacitor C2 is connected in series downstream of the resonator R1. The capacitor C3 is connected in series downstream of the resonator R2, and the capacitor C4 is connected in parallel to the resonator R2.

The two resonators R1 and R2 are mutually attuned such that the resonance frequency of the resonator R1 corresponds to the anti-resonance frequency of the resonator R2. The filter characteristic of the filter arrangement can be changed through the application of a DC voltage to the capacitors C1 and C3, because the relative dielectric constant $\in_r$ of the material of the dielectric 8 is changed thereby. The application of a DC voltage of a few volts is capable of reducing the capacitance values of the capacitors C1 and C3 by up to a factor 10. As a result, the resonance frequencies and the anti-resonance frequencies of the resonators R1 and R2 are shifted, and the filter curve of the filter arrangement is shifted by a few percents. The DC voltage is applied to the electrodes 7 and 9 of the capacitors C1 and C3 through the bump end contacts.

The resulting filter arrangement was used in mobile telephones as a tunable bandpass filter whose filter band can be changed.

Embodiment 3

A reflection element 2 of alternating $\lambda/4$ layers of AlN and $SiO_2$ is present on a substrate 1 of glass. An electrode 5 of Pt/Ti lies on the reflection element 2. A piezoelectric layer 6 of AlN is present on the electrode 5, and an electrode 7 of Pt/Ti lies on the piezoelectric layer 6. The piezoelectric layer 6 and the two electrodes 5, 7 are deposited and structured such that a filter arrangement with a series resonator R1 and a parallel resonator R2 are created. The electrode 5 is deposited and structured such that it also forms the upper electrode of a capacitor C4 adjacent the resonator R2. The electrode 7 is deposited and structured such that it forms the lower electrode of a capacitor C1 as well as the upper electrode of a capacitor C2 in the region of the bulk acoustic wave resonator R2, and forms the lower electrode of a capacitor C3 in the region of the bulk acoustic wave resonator R2. A dielectric 8 of $PbZr_{0.53}Ti_{0.47}O_3$ with 5% lanthanum doping lies on the lower electrodes 7 of the capacitors C1 and C3, and an upper electrode 9 of Pt/Ti is provided on the respective dielectrics 8. The capacitors C2 and C4 each comprise besides an upper electrode of Pt/Ti a dielectric 4 of $Si_3N_4$ and a lower electrode 3 of Al doped with 4% Cu.

A protective layer 10 of $Si_3N_4$ is provided over the entire filter arrangement. Contact holes are etched through the protective layer 10 to the electrodes 3, 5, 7, and 9. Bump end contacts of Cr/Cu/Ni/Au are grown in the contact holes.

A bump end contact to the electrode 5 in the region of the resonator R1 serves as a contact to the filter input 11 of the filter arrangement, and a bump end contact to the electrode 3 in the region of the capacitor C2 serves as a contact for the filter output 12 of the filter arrangement. In addition, a bump end contact to the electrode 9 is connected to ground in the region of the capacitor C3.

The capacitors C1, C2, C3, and C4 and the resonators R1 and R2 are electrically interconnected through suitable vias in the piezoelectric layer 6, the dielectric 8, and the dielectric 4 of the capacitor C4. The capacitor C1 is connected in parallel to the resonator R1, whereas the capacitor C2 is connected in series downstream of the resonator R1. The capacitor C3 is connected in series downstream of the resonator R2, and the capacitor C4 is connected in parallel to the resonator R2.

The two resonators R1 and R2 are mutually attuned such that the resonance frequency of the resonator R1 corresponds to the anti-resonance frequency of the resonator R2. The filter characteristic of the filter arrangement can be changed through the application of a DC voltage to the capacitors C1 and C3, because the relative dielectric constant $\in_r$ of the material of the dielectric 8 is changed thereby. The application of a DC voltage of a few volts is capable of reducing the capacitance values of the capacitors C1 and C3 by up to a factor 10. As a result, the resonance frequencies and the anti-resonance frequencies of the resonators R1 and R2 are shifted, and the filter curve of the filter arrangement is shifted by a few percents. The DC voltage is applied to the electrodes 7 and 9 of the capacitors C1 and C3 through the bump end contacts.

The resulting filter arrangement was used in mobile telephones as a tunable bandpass filter whose filter band can be changed.

Embodiment 4

A reflection element 2 of alternating λ/4 layers of $Ta_2O_5$ and $SiO_2$ is present on a substrate 1 of glass. An electrode 5 of Pt/Ti lies on the reflection element 2. A piezoelectric layer 6 of AlN is present on the electrode 5, and an electrode 7 of Pt/Ti lies on the piezoelectric layer 6. The piezoelectric layer 6 and the two electrodes 5, 7 are deposited and structured such that a filter arrangement with a series resonator R1 and a parallel resonator R2 are created. The electrode 5 is deposited and structured such that it also forms the upper electrode of a capacitor C4 adjacent the resonator R2. The electrode 7 is deposited and structured such that it forms the lower electrode of a capacitor C1 as well as the upper electrode of a capacitor C2 in the region of the bulk acoustic wave resonator R2, and forms the lower electrode of a capacitor C3 in the region of the bulk acoustic wave resonator R2. A dielectric 8 of $PbZr_{0.53}Ti_{0.47}O_3$ with 5% lanthanum doping lies on the lower electrodes 7 of the capacitors C1 and C3, and an upper electrode 9 of Pt/Ti is provided on the respective dielectrics 8. The capacitors C2 and C4 each comprise besides an upper electrode of Pt/Ti a dielectric 4 of $Si_3N_4$ and a lower electrode 3 of Al doped with 4% Cu.

A protective layer 10 of $Si_3N_4$ is provided over the entire filter arrangement. Contact holes are etched through the protective layer 10 to the electrodes 3, 5, 7, and 9. Bump end contacts of Cr/Cu/Ni/Au are grown in the contact holes.

A bump end contact to the electrode 5 in the region of the resonator R1 serves as a contact to the filter input 11 of the filter arrangement, and a bump end contact to the electrode 3 in the region of the capacitor 02 serves as a contact for the filter output 12 of the filter arrangement. In addition, a bump end contact to the electrode 9 is connected to ground in the region of the capacitor C3.

The capacitors C1, C2, C3, and C4 and the resonators R1 and R2 are electrically interconnected through suitable vias in the piezoelectric layer 6, the dielectric 8, and the dielectric 4. The capacitor C1 is connected in parallel to the resonator R1, whereas the capacitor C2 is connected in series downstream of the resonator R1. The capacitor C3 is connected in series downstream of the resonator R2, and the capacitor C4 is connected in parallel to the resonator R2.

The two resonators R1 and R2 are mutually attuned such that the resonance frequency of the resonator R1 corresponds to the anti-resonance frequency of the resonator R2. The filter characteristic of the filter arrangement can be changed through the application of a DC voltage to the capacitors C1 and C3, because the relative dielectric constant $\in_r$ of the material of the dielectric 8 is changed thereby. The application of a DC voltage of a few volts is capable of reducing the capacitance values of the capacitors C1 and C3 by up to a factor 10. As a result, the resonance frequencies and the anti-resonance frequencies of the resonators R1 and R2 are shifted, and the filter curve of the filter arrangement is shifted by a few percents. The DC voltage is applied to the electrodes 7 and 9 of the capacitors C1 and C3 through the bump end contacts.

The resulting filter arrangement was used in mobile telephones as a tunable bandpass filter whose filter band can be changed.

Embodiment 5

A reflection element 2 with alternating λ/4 layers of $Ta_2O_5$ and $SiO_2$ is present on a silicon substrate 1 with a passivating layer of $SiO_2$. An electrode 5 of Ti/Pt lies on the reflection element 2. A piezoelectric layer 6 of AlN lies on the electrode 5, and an electrode 7 of Ti/Pt lies on the piezoelectric layer 6. The piezoelectric layer 6 and the two electrodes 5, 7 are deposited and structured such that a filter arrangement with a series resonator R1 and a parallel resonator R2 are created. The electrode 5 is deposited and structured such that it also forms the upper electrode of a capacitor C4 adjacent the resonator R2. The electrode 7 is deposited and structured such that it forms the lower electrode of a capacitor C1 as well as the upper electrode of a capacitor C2 in the region of the bulk acoustic wave resonator R2, and forms the lower electrode of a capacitor C3 in the region of the bulk acoustic wave resonator R2. A dielectric 8 of $PbZr_{0.53}Ti_{0.47}O_3$ with 5% lanthanum doping lies on the lower electrodes 7 of the capacitors C1 and C3, and an upper electrode 9 of Pt/Ti is provided on the respective dielectrics 8. The capacitors C2 and C4 each comprise besides an upper electrode of Pt/Ti a dielectric 4 of $Si_3N_4$ and a lower electrode 3 of Ti/Pt.

A protective layer 10 of $Si_3N_4$ is provided over the entire filter arrangement. Contact holes are etched through the protective layer 10 to the electrodes 3, 5, 7, and 9. Bump end contacts of Cr/Cu/Ni/Au are grown in the contact holes.

A bump end contact to the electrode 5 in the region of the resonator R1 serves as a contact to the filter input 11 of the filter arrangement, and a bump end contact to the electrode 3 in the region of the capacitor R2 serves as a contact for the filter output 12 of the filter arrangement. In addition, a bump end contact to the electrode 9 is connected to ground in the region of the capacitor C3.

The capacitors C1, C2, C3, and C4 and the resonators R1 and R2 are electrically interconnected through suitable vias in the piezoelectric layer 6, the dielectric 8, and the dielectric 4. The capacitor C1 is connected in parallel to the resonator R1, whereas the capacitor C2 is connected in series downstream of the resonator R1. The capacitor C3 is connected in series downstream of the resonator R2, and the capacitor C4 is connected in parallel to the resonator R2.

The two resonators R1 and R2 are mutually attuned such that the resonance frequency of the resonator R1 corresponds to the anti-resonance frequency of the resonator R2.

The filter characteristic of the filter arrangement can be changed through the application of a DC voltage to the capacitors C1 and C3, because the relative dielectric constant $\in_r$ of the material of the dielectric 8 is changed thereby. The application of a DC voltage of a few volts is capable of reducing the capacitance values of the capacitors C1 and C3 by up to a factor 10. As a result, the resonance frequencies and the anti-resonance frequencies of the resonators R1 and R2 are shifted, and the filter curve of the filter arrangement is shifted by a few percents. The DC voltage is applied to the electrodes 7 and 9 of the capacitors C1 and C3 through the bump end contacts.

The resulting filter arrangement was used in mobile telephones as a tunable bandpass filter whose filter band can be changed.

Embodiment 6

A reflection element 2 with alternating $\lambda/4$ layers of $Ta_2O_5$ and $SiO_2$ is present on a silicon substrate 1 with a passivating layer of $SiO_2$. An electrode 5 of Ti/Pt lies on the reflection element 2. A piezoelectric layer 6 of AlN lies on the electrode 5, and an electrode 7 of Ti/Pt lies on the piezoelectric layer 6. The piezoelectric layer 6 and the two electrodes 5, 7 are deposited and structured such that a filter arrangement with a series resonator R1 and a parallel resonator R2 are created. The electrode 5 is deposited and structured such that it also forms the upper electrode of a capacitor C4 adjacent the resonator R2. The electrode 7 is deposited and structured such that it forms the lower electrode of a capacitor C1 as well as the upper electrode of a capacitor C2 in the region of the bulk acoustic wave resonator R2, and forms the lower electrode of a capacitor C3 in the region of the bulk acoustic wave resonator R2. A dielectric 8 of $PbZr_{0.53}Ti_{0.47}O_3$ with 5% lanthanum doping lies on the lower electrodes 7 of the capacitors C1 and C3, and an upper electrode 9 of Pt/Ti is provided on the respective dielectrics 8. The capacitors C2 and C4 each comprise besides an upper electrode of Pt/Ti a dielectric 4 of $Si_3N_4$ and a lower electrode 3 of Al doped with 4% Cu, which is separately deposited.

A protective layer 10 of $Si_3N_4$ is provided over the entire filter arrangement. Contact holes are etched through the protective layer 10 to the electrodes 3, 5, 7, and 9. Bump end contacts of Cr/Cu/Ni/Au are grown in the contact holes.

A bump end contact to the electrode 5 in the region of the resonator R1 serves as a contact to the filter input 11 of the filter arrangement, and a bump end contact to the electrode 3 in the region of the capacitor R2 serves as a contact for the filter output 12 of the ail filter arrangement. In addition, a bump end contact to the electrode 9 is connected to ground in the region of the capacitor C3.

The capacitors C1, C2, C3, and C4 and the resonators R1 and R2 are electrically interconnected through suitable vias in the piezoelectric layer 6, the dielectric 8, and the dielectric 4. The capacitor C1 is connected in parallel to the resonator R1, whereas the capacitor C2 is connected in series downstream of the resonator R1. The capacitor C3 is connected in series downstream of the resonator R2, and the capacitor C4 is connected in parallel to the resonator R2.

The two resonators R1 and R2 are mutually attuned such that the resonance frequency of the resonator R1 corresponds to the anti-resonance frequency of the resonator R2. The filter characteristic of the filter arrangement can be changed through the application of a DC voltage to the capacitors C1 and C3, because the relative dielectric constant $\in_r$ of the material of the dielectric 8 is changed thereby. The application of a DC voltage of a few volts is capable of reducing the capacitance values of the capacitors C1 and C3 by up to a factor 10. As a result, the resonance frequencies and the anti-resonance frequencies of the resonators R1 and R2 are shifted, and the filter curve of the filter arrangement is shifted by a few percents. The DC voltage is applied to the electrodes 7 and 9 of the capacitors C1 and C3 through the bump end contacts.

The resulting filter arranged was used in mobile telephones as a tunable bandpass filter whose filter band can be changed.

What is claimed is:

1. A tunable filter arrangement which comprises a substrate (1) and provided on said substrate a reflection element (2) and an arrangement of at least two mutually coupled resonators of which at least one is connected in parallel relation to a capacitor with tunable capacitance, said at least one resonator further comprising an upper electrode and a lower electrode with a piezoelectric layer therebetween, wherein said capacitor comprises a dielectric (8) made of a material having a voltage-dependent relative dielectric constant $\in$.

2. A tunable filter arrangement as claimed in claim 1, characterized in that the material with a voltage-dependent relative dielectric constant $\in_r$ is chosen from the group comprising $PbTi_{1-x}Zr_xO_3$ ($0 \leq x \leq 1$) with and without dopants of La, Nb or Mn; $BaTiO_3$, with and without dopants; $Sr_xTiO_3$ with and without dopants; $Ba_{1-x}Sr_xTiO_3$ ($0 \leq x \leq 1$) with dopants of Ca and Pb; $Ba_{1-x}Sr_xTiO_3$ ($0 < x < 1$)+MgO; $Ba_{1-x}Sr_xTiO_3$—$Pb_{1-y}Ca_yTiO_3$ ($0 \leq x \leq 1$, $0 \leq y \leq 1$); $CaTiO_3$ doped with Bi, $Sr_{n+1}Ti_nO_{3n+1}$ ($1 \leq n \leq 5$); $Pb_{1-x}Ca_xTiO_3$ ($0 \leq x \leq 1$); $Ba_{1-x}Sr_xTiO_3$ ($0 \leq x \leq 1$) with and without added $VO_x$ ($1 \leq x \leq 2.5$) and/or $SiO_2$; $Ba_{1-x}Sr_xZr_yTi_{1-y}O_3$ ($0 \leq x \leq 1$, $0 \leq y \leq 1$) with and without dopants; $Ba_{1-x}Pb_xTiO_3$ ($0 \leq x \leq 1$); $Ba_{1-x}Ca_xTiO_3$ ($0 \leq x \leq 1$); $SrZr_xTi_{1-x}O_3$ ($0 \leq x \leq 1$) with and without dopants; $[PbMg_{1/3}Nb_{2/3}O_3]_x$—$[PbTiO_3]_{1-x}$ ($0 \leq x \leq 1$); $(Pb,B_a,Sr)(Mg_{1/3}Nb_{2/3})_xTi_y(Zn_{1/3}Nb_{2/3})_{1-x-y}O_3$ ($0 \leq x \leq 1$, $0 \leq y \leq 1$); $Pb_{1-x}Ca_xTiO_3$ ($0 \leq x \leq 1$); $(Ba_{1-x+y/8}Sr_{x+y/8})_2Na_{1-y}Nb_5O_{15}$ ($0 \leq x \leq 1$, $0 \leq y \leq 1$); $(Ba_{1-x+y/8}Sr_{x+y/8})_2K_{1-y}Nb_5O_{15}$ ($0 \leq x \leq 1$, $0 \leq y \leq 1$); $(Ba_{1-x}Sr_x)_2K_{1-3y}SE_yNb_5O_{15}$ ($0 \leq x \leq 1$, $0 \leq y \leq 1$, SE=ion from the group of rare earths); $Sr_2Ba_4Ti_2Nb_8O_{30}$; $BiNbO_4$ with and without $VO_x$ ($1 \leq x \leq 2.5$) and/or CuO dopants; $(Bi_{2-x}Zn_x)(Nb_{2-y}Zn_y)O_x$; $Bi_2(Zn_{1/3}Nb_{2/3})_2O_7$;

a) $Pb(Mg_{1/2}W_{1/2})O_3$;
b) $Pb(Fe_{1/2}Nb_{1/2})O_3$;
c) $Pb(Fe_{2/3}W_{1/3})O_3$;
d) $Pb(Ni_{1/3}Nb_{2/3})O_3$;
e) $Pb(Zn_{1/3}Nb_{2/3})O_3$;
f) $Pb(Sc_{1/2}Ta_{1/2})O_3$;

combinations of the compounds a) to f) with $PbTiO_3$ and/or $Pb(Mg_{1/3}Nb_{2/3})O_3$; and $Ba_{1-x}Zr_xTiO_3$ ($0 \leq x \leq 1$).

3. A tunable filter arrangement as claimed in claim 1, characterized in that the resonators are constructed in a thin-film technology process.

4. A tunable filter arrangement which comprises a substrate (1) and provided on said substrate a reflection element (2) and an arrangement of at least two mutually coupled resonators each comprising an upper electrode and a lower electrode with a piezoelectric layer therebetween, a first one of said resonators is connected in parallel relation to a first capacitor and in series relation to a second capacitor, a second one of said resonators is connected in parallel to a third capacitor and in series relation to a fourth capacitor, wherein at least one of said first and second capacitors and at least one of said third and fourth capacitors are tunable and comprise a dielectric (8) made of a material having a voltage-dependent relative dielectric constant $\in$.

5. The tunable filter arrangement as claimed in claim 4, wherein said first capacitor and said fourth capacitor are tunable.

6. A tunable filter arrangement as claimed in claim 4, characterized in that the material with a voltage-dependent relative dielectric constant $\in_r$ is chosen from the group comprising $PbTi_{1-x}Zr_xO_3$ ($0 \leq x \leq 1$) with and without dopants of La, Nb or Mn; $BaTiO_3$, with and without dopants; $Sr_xTiO_3$ with and without dopants; $Ba_{1-x}Sr_xTiO_3$ ($0 \leq x \leq 1$) with dopants of Ca and Pb; $Ba_{1-x}Sr_xTiO_3$ ($0<x<1$)+MgO; $Ba_{1-x}Sr_xTiO_3$—$Pb_{1-y}Ca_yTiO_3$ ($0 \leq x \leq 1$, $0 \leq y \leq 1$); $CaTiO_3$ doped with Bi, $Sr_{n+1}Ti_nO_{3n+1}$ ($1 \leq n \leq 5$); $Pb_{1-x}Ca_xTiO_3$ ($0 \leq x \leq 1$); $Ba_{1-x}Sr_xTiO_3$ ($0 \leq x \leq 1$) with and without added $VO_x$ ($1 \leq x \leq 2.5$) and/or $SiO_2$; $Ba_{1-x}Sr_xZr_yTi_{1-y}O_3$ ($0 \leq x \leq 1$, $0 \leq y \leq 1$) with and without dopants; $Ba_{1-x}Pb_xTiO_3$ ($0 \leq x \leq 1$); $Ba_{1-x}Ca_xTiO_3$ ($0 \leq x \leq 1$); $SrZr_xTi_{1-x}O_3$ ($0 \leq x \leq 1$) with and without dopants; $[PbMg_{1/3}Nb_{2/3}O_3]_x$—$[PbTiO_3]_{1-x}$ ($0 \leq x \leq 1$); $(Pb,B_a,Sr)(Mg_{1/3}Nb_{2/3})_xTi_y(Zn_{1/3}Nb_{2/3})_{1-x-y}O_3$ ($0 \leq x \leq 1$, $0 \leq y \leq 1$); $Pb_{1-x}Ca_xTiO_3$ ($0 \leq x \leq 1$); $(Ba_{1-x+y/8}Sr_{x+y/8})_2Na_{1-y}Nb_5O_{15}$ ($0 \leq x \leq 1$, $0 \leq y \leq 1$); $(Ba_{1-x+y/8}Sr_{x+y/8})_2K_{1-y}Nb_5O_{15}$ ($0 \leq x \leq 1$, $0 \leq y \leq 1$); $(Ba_{1-x}Sr_x)_2K_{1-3y}SE_yNb_5O_{15}$ ($0 \leq x \leq 1$, $0 \leq y \leq 1$, SE=ion from the group of rare earths); $Sr_2Ba_4Ti_2Nb_8O_{30}$; $BiNbO_4$ with and without $VO_x$ ($1 \leq x \leq 2.5$) and/or CuO dopants; $(Bi_{2-x}Zn_x)(Nb_{2-y}Zn_y)O_x$; $Bi_2(Zn_{1/3}Nb_{2/3})_2O_7$;

a) $Pb(Mg_{1/2}W_{1/2})O_3$;

b) $Pb(Fe_{1/2}Nb_{1/2})O_3$;

c) $Pb(Fe_{2/3}W_{1/3})O_3$;

d) $Pb(Ni_{1/3}Nb_{2/3})O_3$;

e) $Pb(Zn_{1/3}Nb_{2/3})O_3$;

f) $Pb(Sc_{1/2}Ta_{1/2})O_3$;

combinations of the compounds a) to f) with $PbTiO_3$ and/or $Pb(Mg_{1/3}Nb_{2/3})O_3$; and $Ba_{1-x}Zr_xTiO_3$ ($0 \leq x \leq 1$).

7. A tunable filter arrangement as claimed in claim 4, characterized in that the resonators are constructed in a thin-film technology process.

* * * * *